(12) United States Patent
Kinoshita et al.

(10) Patent No.: US 11,239,356 B2
(45) Date of Patent: Feb. 1, 2022

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Akimasa Kinoshita, Matsumoto (JP); Yasuyuki Hoshi, Matsumoto (JP); Yuichi Harada, Matsumoto (JP); Yasuhiko Oonishi, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 64 days.

(21) Appl. No.: 15/283,501

(22) Filed: Oct. 3, 2016

(65) Prior Publication Data

US 2017/0025524 A1    Jan. 26, 2017

Related U.S. Application Data

(63) Continuation of application No. PCT/JP2015/072909, filed on Aug. 13, 2015.

(30) Foreign Application Priority Data

Sep. 8, 2014    (JP) .............................. JP2014-182767

(51) Int. Cl.
*H01L 29/76* (2006.01)
*H01L 29/78* (2006.01)
(Continued)

(52) U.S. Cl.
CPC .... *H01L 29/7802* (2013.01); *H01L 21/02378* (2013.01); *H01L 21/02529* (2013.01);
(Continued)

(58) Field of Classification Search
CPC ......... H01L 21/02378; H01L 21/02529; H01L 21/02634; H01L 21/0475; H01L 21/0485;
(Continued)

(56) References Cited

U.S. PATENT DOCUMENTS 4,291,329 A * 9/1981 Hanes .................... H01L 21/263
257/156
5,243,205 A * 9/1993 Kitagawa .............. H01L 21/263
257/173
(Continued)

FOREIGN PATENT DOCUMENTS

JP    H03-259537 A    11/1991
JP    2003-264288 A    9/2003
(Continued)

*Primary Examiner* — Meiya Li
(74) *Attorney, Agent, or Firm* — Rabin & Berdo, P.C.

(57) ABSTRACT

A semiconductor device includes an N-type silicon carbide layer, a P-type region, an N-type source region, a P-type contact region, a gate insulating film, a gate electrode, and a source electrode on the front surface side of an N-type silicon carbide substrate. A drain electrode is located on the back surface of the N-type silicon carbide substrate. A life time killer introduction region is located along an entire interface of the N-type silicon carbide layer and the bottom face of the P-type region. The life time killer is introduced by implanting helium or protons from the back surface side of the N-type silicon carbide substrate after forming a surface structure of an element on the front surface side of the N-type silicon carbide substrate and before forming the drain electrode.

8 Claims, 6 Drawing Sheets

(51) Int. Cl.
*H01L 21/265* (2006.01)
*H01L 29/32* (2006.01)
*H01L 21/02* (2006.01)
*H01L 21/04* (2006.01)
*H01L 21/22* (2006.01)
*H01L 21/304* (2006.01)
*H01L 29/06* (2006.01)
*H01L 29/08* (2006.01)
*H01L 29/10* (2006.01)
*H01L 29/16* (2006.01)
*H01L 29/36* (2006.01)
*H01L 29/417* (2006.01)
*H01L 29/66* (2006.01)
*H01L 21/266* (2006.01)

(52) U.S. Cl.
CPC ...... H01L 21/02634 (2013.01); H01L 21/049 (2013.01); H01L 21/0475 (2013.01); H01L 21/0485 (2013.01); H01L 21/221 (2013.01); H01L 21/26506 (2013.01); H01L 21/304 (2013.01); H01L 29/0684 (2013.01); H01L 29/0865 (2013.01); H01L 29/1079 (2013.01); H01L 29/1608 (2013.01); H01L 29/32 (2013.01); H01L 29/36 (2013.01); H01L 29/41741 (2013.01); H01L 29/66068 (2013.01); H01L 29/66712 (2013.01); *H01L 21/266* (2013.01); *H01L 29/0878* (2013.01)

(58) Field of Classification Search
CPC ................ H01L 21/049; H01L 21/221; H01L 21/26506; H01L 21/304; H01L 29/0684; H01L 29/0865; H01L 29/1079; H01L 29/1608; H01L 29/36; H01L 29/41741; H01L 29/7802; H01L 21/266; H01L 29/66068; H01L 29/66712; H01L 29/0878; H01L 29/32

USPC ..................................................... 257/77–82
See application file for complete search history.

(56) References Cited

U.S. PATENT DOCUMENTS

| | | | |
|---|---|---|---|
| 6,821,886 | B1 | 11/2004 | Layadi et al. |
| 6,967,374 | B1 | 11/2005 | Saito et al. |
| 9,960,235 | B2 | 5/2018 | Hoshi et al. |
| 2010/0140697 | A1 | 6/2010 | Yedinak et al. |
| 2010/0148244 | A1* | 6/2010 | Kitabatake ............... H01L 24/06 257/328 |
| 2010/0327313 | A1 | 12/2010 | Nakamura |
| 2011/0233666 | A1 | 9/2011 | Lui et al. |
| 2011/0316071 | A1* | 12/2011 | Hatori ................. H01L 29/0696 257/328 |
| 2012/0169262 | A1 | 7/2012 | Nakajima |
| 2013/0062624 | A1* | 3/2013 | Tsuchiya ........... H01L 29/0839 257/77 |
| 2013/0134478 | A1* | 5/2013 | Nakajima ........... H01L 29/7395 257/139 |
| 2013/0234161 | A1 | 9/2013 | Shimizu et al. |
| 2014/0299887 | A1 | 10/2014 | Matocha et al. |
| 2015/0102363 | A1* | 4/2015 | Tanaka ................. H01L 21/046 257/77 |
| 2015/0171175 | A1* | 6/2015 | Takaya ................ H01L 29/1095 257/330 |
| 2017/0229541 | A1* | 8/2017 | Nakamura .......... H01L 21/0465 |

FOREIGN PATENT DOCUMENTS

| | | |
|---|---|---|
| JP | 2006-024690 A | 1/2006 |
| JP | 2009-164440 A | 7/2009 |
| JP | 2012-142330 A | 7/2012 |
| JP | 2013-102106 A | 5/2013 |
| JP | 2013-187302 A | 9/2013 |
| JP | 2013-247252 A | 12/2013 |
| WO | WO 2009-122486 A1 | 10/2009 |

* cited by examiner

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2015/072909 filed on Aug. 13, 2015 which claims priority from a Japanese Patent Application No. 2014-182767 filed on Sep. 8, 2014, the contents of which are incorporated herein by reference.

BACKGROUND OF THE INVENTION

1. Field of the Invention

Embodiments discussed herein are related to a semiconductor device and a method manufacturing a semiconductor device.

2. Description of the Related Art

A vertical metal oxide semiconductor field-effect transistor (MOSFET) is a conventional semiconductor device that uses silicon carbide semiconductor (see, for example, Japanese Laid-Open Patent Publication Nos. 2013-187302 and 2013-102106). In the vertical MOSFET, when a voltage lower than the threshold value is applied to the gate electrode, an OFF-state is established and no current flows between the source and the drain and when a voltage equal to or higher than the threshold value is applied to the gate electrode, an ON-state is established and current flows between the source and the drain. In this manner, a switching operation of the MOSFET may be executed according to the voltage applied to the gate electrode. On the other hand, a silicon carbide semiconductor device is present that has a recombination region having a recombination center introduced therein disposed beneath a high concentration P-type region between an N-type source region and an N-type source region that are adjacent to each other (see, for example, Japanese Laid-Open Patent Publication No. 2009-164440).

SUMMARY OF THE INVENTION

According to one aspect of the present invention, a semiconductor device includes a silicon carbide substrate of a first conductivity type; a silicon carbide layer of the first conductivity type, disposed on a front surface of the silicon carbide substrate and having an impurity concentration lower than that of the silicon carbide substrate; a first region of a second conductivity type, disposed in a portion of a surface region of the silicon carbide layer; a source region of the first conductivity type, disposed in a surface region of the first region; a contact region of a second conductivity type, disposed in the surface region of the first region and having an impurity concentration higher than that of the first region; a source region disposed so as to contact the source region and the contact region; a gate insulating film disposed on a surface of a region of the first region, between the silicon carbide layer and the source region; a gate electrode disposed on the gate insulating film; and a drain electrode disposed on a back surface of the silicon carbide substrate. The semiconductor device further includes in at least an entire interface of the silicon carbide layer and a bottom face of the first region, a life time killer introduction region in which a life time killer is implanted. The life time killer introduction region is disposed in an entire region at a depth equal to that of the interface of the silicon carbide layer and the bottom face of the first region.

According to another aspect of the present invention, semiconductor device includes a silicon carbide substrate of a first conductivity type; a first silicon carbide layer of a first conductivity type, disposed on a front surface of the silicon carbide substrate and having an impurity concentration lower than that of the silicon carbide substrate; a base region of a second conductivity type, disposed in a portion of a surface region of the silicon carbide layer; a second silicon carbide layer of a second conductivity type, disposed on a surface of the first silicon carbide layer; a first region of the first conductivity type, disposed in the second silicon carbide layer so as to penetrate the second silicon carbide layer and contact the first silicon carbide layer, the first region having an impurity concentration lower than that of the silicon carbide substrate; a source region of the first conductivity type, disposed in a surface region of the second silicon carbide layer, away from the first region, the source region having an impurity concentration higher than that of the first region; a contact region of the second conductivity type, disposed in the second silicon carbide layer so as to penetrate the second silicon carbide layer and contact the base region, the contact region having an impurity concentration higher than that of the base region; a source electrode disposed so as to contact the source region and the contact region; a gate insulating film that is disposed on a surface of a region of the second silicon carbide layer, between the first region and the source region; a gate electrode that is disposed on the gate insulating film; and a drain electrode disposed on a back surface of the silicon carbide substrate. The semiconductor device further includes in at least an entire interface of the first silicon carbide layer and a bottom face of the base region a life time, a killer introduction region in which a life time killer is implanted. The life time killer introduction region is disposed in an entire region at a depth equal to that of the interface of the first silicon carbide layer and the bottom face of the second conductivity type base region.

In the semiconductor device, the life time killer is helium or protons.

According to an aspect of the present invention, a method of manufacturing a semiconductor device, includes forming a surface structure of an element that includes a silicon carbide layer of a first conductivity type on a front surface of a silicon carbide substrate of the first conductivity type, and a gate insulating film, a gate electrode, a source region, and a source electrode on a front surface side of a silicon carbide semiconductor having a first region of a second conductivity type in a portion of a surface region of the silicon carbide layer; forming a time life killer introduction region by implanting a life time killer at a depth equal to that of an interface of the silicon carbide layer and a bottom face of the first region, from a back surface side of the silicon carbide substrate; and forming a drain electrode on the back surface of the silicon carbide substrate after introducing the life time killer.

According to another aspect of the present invention, a method of manufacturing a semiconductor device, includes forming a surface structure of an element that includes a first silicon carbide layer of a first conductivity type on a front surface of a silicon carbide substrate of the first conductivity type, a base region of a second conductivity type in a portion of a surface region of the first silicon carbide layer, and a gate insulating film, a gate electrode, a source region, and a source electrode on a front surface side of a silicon carbide semiconductor having a second silicon carbide layer of the second conductivity type on surfaces of the first silicon carbide layer and the base region; forming a time life killer introduction region by implanting a life time killer at a depth equal to that of an interface of the first silicon carbide layer and a bottom face of the base region, from a back surface side of the silicon carbide substrate; and forming a drain electrode on the back surface of the silicon carbide substrate after introducing the life time killer.

The method further includes adjusting a thickness of the silicon carbide substrate by grinding the back surface of the silicon carbide substrate before introducing the life time killer.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
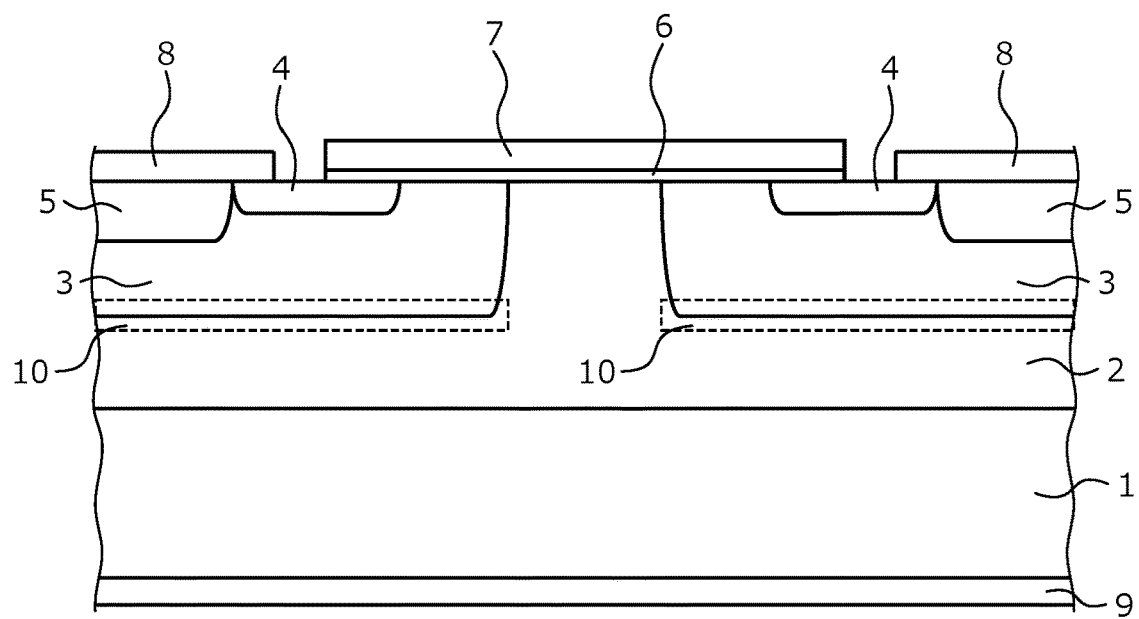
FIG. 1 is a cross-sectional view of a semiconductor device according to a first embodiment of the present invention.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

FIG. 1 is a cross-sectional view of a semiconductor device according to a first embodiment of the present invention. FIG. 1 depicts an active region of the semiconductor device. In the active region, a metal oxide semiconductor (MOS) structure, that is, an element structure of the semiconductor device is disposed. The active region may be surrounded by a surrounding edge termination structure region not depicted.

As depicted in FIG. 1, the semiconductor device includes an N-type silicon carbide semiconductor substrate 1 and an N-type silicon carbide semiconductor layer 2 that each includes silicon carbide. The N-type silicon carbide semiconductor substrate 1 may be, for example, a silicon carbide single crystal substrate having an N-type impurity doped in silicon carbide. The N-type silicon carbide semiconductor substrate 1 forms, for example, a drain region.

The N-type silicon carbide semiconductor layer 2 is disposed on a front surface of the N-type silicon carbide semiconductor substrate 1. The impurity concentration of the N-type silicon carbide semiconductor layer 2 is lower than that of the N-type silicon carbide semiconductor substrate 1. The N-type silicon carbide semiconductor layer 2 may be, for example, a semiconductor layer having an N-type impurity doped in silicon carbide. The N-type silicon carbide semiconductor layer 2 forms, for example, an N-type drift layer.

The semiconductor device includes, for example, a P-type region 3, an N-type source region 4, a P-type contact region 5, a gate insulating film 6, a gate electrode 7, and a source electrode 8 as a MOS structure on the front surface side of the N-type silicon carbide semiconductor substrate 1. The semiconductor device includes, for example, a back surface electrode to be a drain electrode 9 on the back surface side of the N-type silicon carbide semiconductor substrate 1. The semiconductor apparatus includes a life time killer introduction region 10.

The P-type region 3 is disposed in a portion of the surface region of the N-type silicon carbide semiconductor layer 2. The P-type region 3, for example, may be disposed to sandwich another portion of the surface region of the N-type silicon carbide semiconductor layer 2. The P-type region 3 may be, for example, a semiconductor region having a P-type impurity doped in silicon carbide.

As indicated by a dotted line in FIG. 1, the life time killer introduction region 10 is disposed in the overall interface between the bottom face of the P-type region 3 and the N-type silicon carbide layer 2 at a depth of the interface between the P-type region 3 and the N-type silicon carbide layer 2. The life time killer introduction region 10 may be disposed at a depth of, for example, about 0.2 μm to about 2.0 μm from the surface of the N-type silicon carbide layer 2. The life time killer introduction region 10 may be disposed in an interface between the bottom face of the P-type region 3 and the N-type silicon carbide layer 2, and in the N-type silicon carbide layer 2 up to the depth of, for example, about 10 μm from this interface. The life time killer is introduced in the life time killer introduction region 10. The life time killer may be lattice defects produced by helium (He) or protons introduced into the life time killer introduction region 10.

The N-type source region 4 is disposed in the surface region of the P-type region 3. The N-type source region 4 is disposed away from the surface region between the P-type region 3 and the P-type region 3 that are adjacent to each other. The impurity concentration of the N-type source region 4 is higher than that of the N-type silicon carbide layer 2.

In the surface region of the P-type region 3, the P-type contact region 5 is disposed on the side of the N-type silicon carbide layer 2, opposite the side of the surface region between adjacent P-type regions 3, the P-type contact region 5 sandwiching the N-type source region 4 therebetween. The P-type contact region 5 contacts the P-type region 3 and the N-type source region 4. The impurity concentration of the P-type contact region 5 is higher than that of the P-type region 3.

The gate insulating film 6 is disposed on the surface of the P-type region 3 between the N-type source region 4 and a region of the N-type silicon carbide layer 2 sandwiched by the P-type regions 3.

The gate electrode 7 is disposed on the surface of the gate insulating film 6. The gate electrode 7 is connected to a gate pad not depicted.

The source electrode 8 is disposed on the surfaces of the N-type source region 4 and the P-type contact region 5 so as to contact the N-type source region 4 and the P-type contact region 5. The source electrode 8 is electrically connected to the N-type source region 4 and the P-type contact region 5. The source electrode 8 is insulated from the gate electrode 7 by an interlayer insulating film not depicted.

The drain electrode 9 is disposed on the back surface of the N-type semiconductor substrate 1. The drain electrode 9 forms an ohmic contact with the N-type semiconductor substrate 1.

Figure 2:
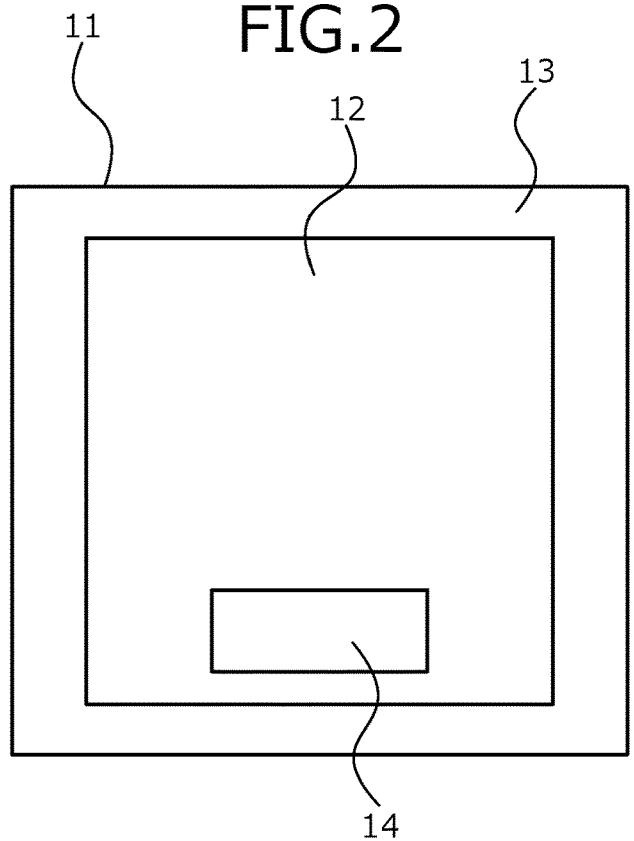
FIG. 2 is a diagram of one example of a planar layout of the semiconductor device depicted in FIG. 1.

FIG. 2 is a diagram of one example of a planar layout of the semiconductor device depicted in FIG. 1. In FIG. 2, reference numeral "11" denotes a chip of the semiconductor device, reference numeral "12" denotes an active region, reference numeral "13" denotes a surrounding breakdown voltage structure region, and a reference numeral "14" denotes a gate pad. The active region 12 has a MOS structure, that is, an element structure of the semiconductor device disposed therein. The surrounding breakdown voltage structure region 13 is disposed in a circumferential edge portion of the chip 11 to surround the active region 12. The gate pad 14 is disposed in the active region 12. The P-type region 3 or the P-type contact region 5 is disposed beneath the gate pad 14. The disposition of the gate pad 14 is not limited to the example depicted in FIG. 2.

Figure 3:
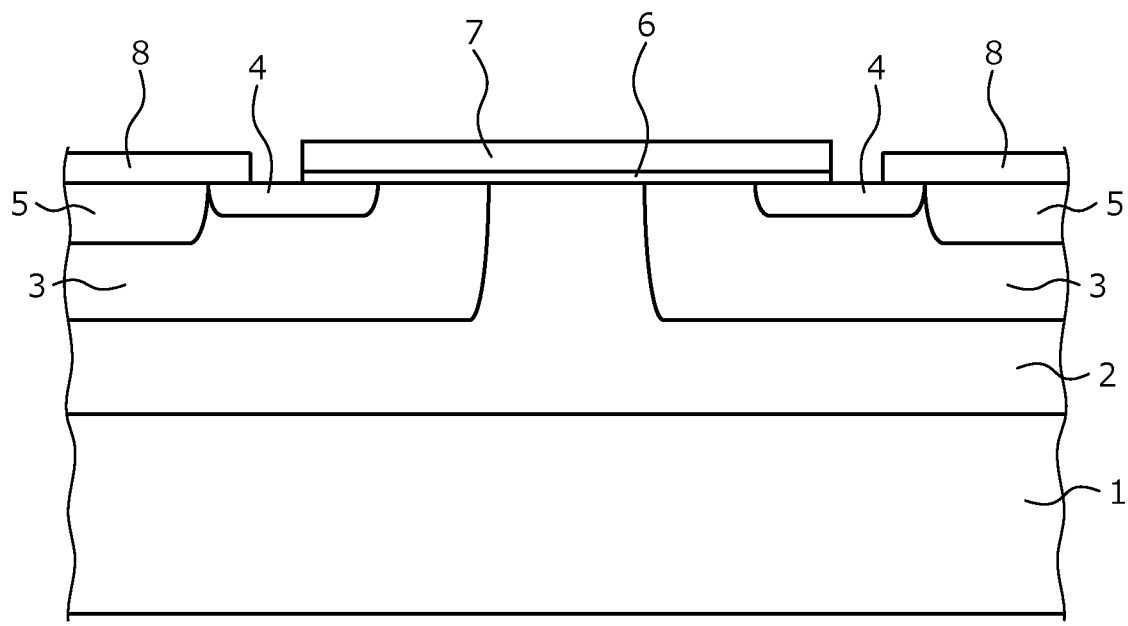
FIG. 3 is a cross-sectional view of a state of the semiconductor device depicted in FIG. 1 during manufacture.
Figure 4:
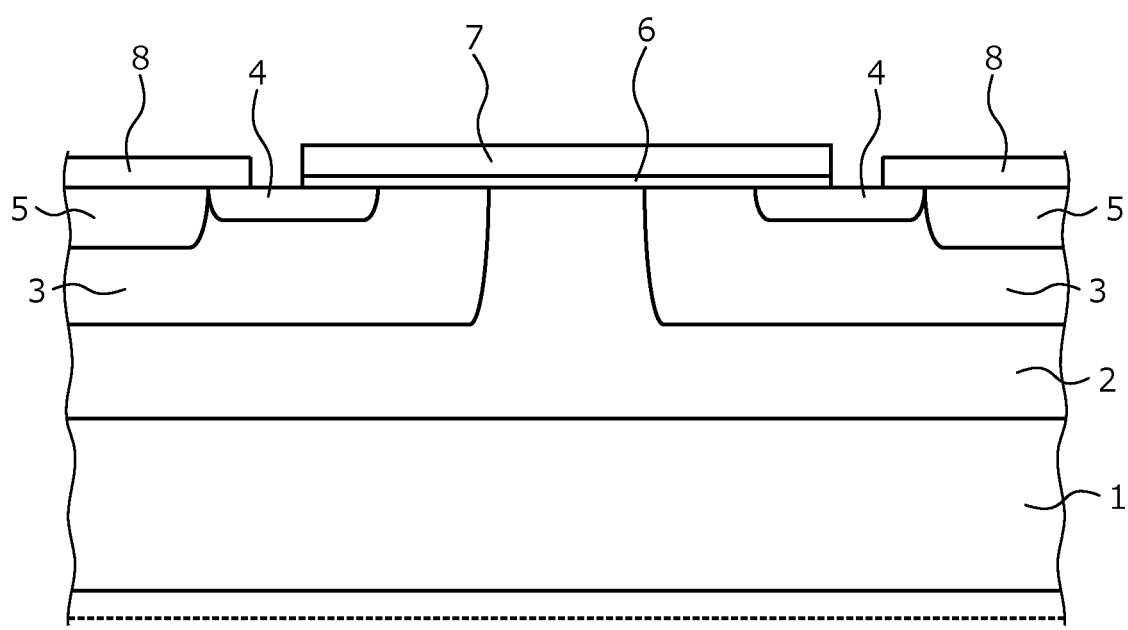
FIG. 4 is a cross-sectional view of a stage subsequent to that depicted in FIG. 3.
Figure 5:
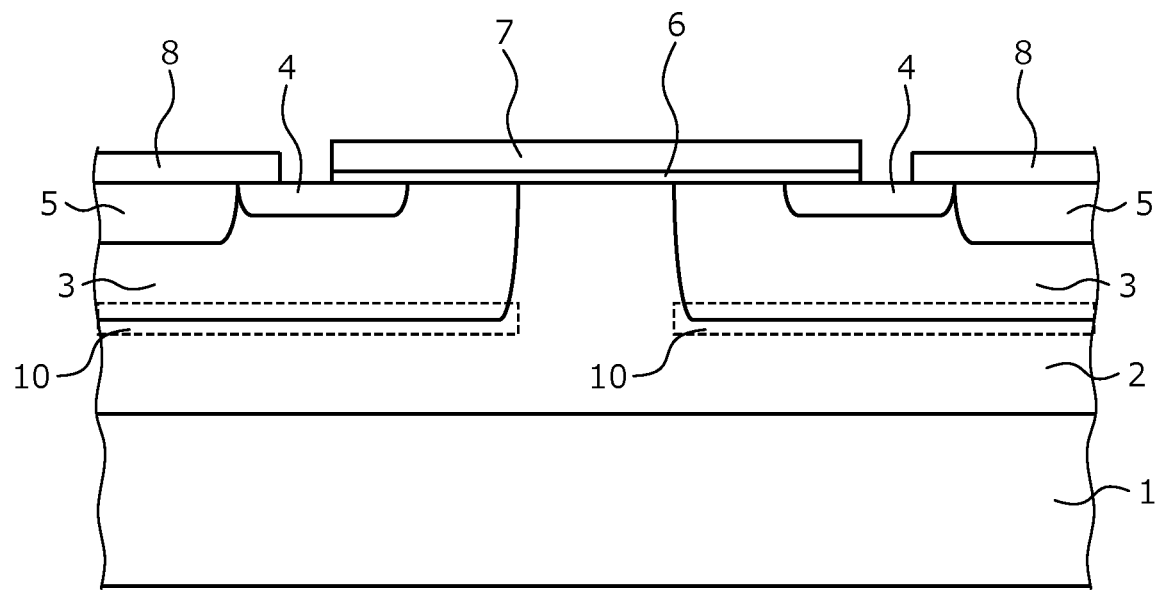
FIG. 5 is a cross-sectional view of a stage subsequent to that depicted in FIG. 4.

FIG. 3 is a cross-sectional view of the state of the semiconductor device depicted in FIG. 1 during manufacture. FIG. 4 is a cross-sectional view of the subsequent stage of that in FIG. 3. FIG. 5 is a cross-sectional view of a stage subsequent to that in FIG. 4. FIGS. 3 to 5 each depict a portion of the active region and do not depict the surrounding breakdown voltage structure region.

As depicted in FIG. 3, the N-type silicon carbide substrate 1 including N-type silicon carbide is first prepared. The N-type silicon carbide layer 2 including silicon carbide is epitaxial-grown being concurrently doped with, for example, an N-type impurity, on the front surface of the N-type silicon carbide substrate 1.

A P-type impurity is ion-implanted into the region to be the P-type region 3 of the surface region of the N-type silicon carbide layer 2 by a photolithography technique and an ion implantation method. An N-type impurity is ion-implanted into the region to be the N-type source region 4 of an ion-implanted region to be the P-type region 3 by a photolithography technique and an ion implantation method.

A P-type impurity is ion-implanted into the region to be the P-type contact region 5 of the ion-implanted region to be the P-type region 3 by a photolithography technique and an ion implantation method. The order of the ion implantation to dispose the P-type region 3, the ion implantation to dispose the N-type source region 4, and the ion implantation to dispose the P-type contact region 5 is not limited to the above and may be changed variously.

The ion-implanted regions to be, for example, the P-type region 3, the N-type source region 4, and the P-type contact region 5 are activated by executing heat treatment (annealing). The P-type region 3, the N-type source region 4, and the P-type contact region 5 are thereby formed. The ion-implanted regions may be activated collectively by a single heat treatment session as above, or each of the ion-implanted regions may be activated by executing the heat treatment each time the ion implantation is executed for a region.

The face on the side where the P-type region 3, the N-type source region 4, and the P-type contact region 5 are disposed is thermally oxidized to dispose the gate insulating film 6 on the overall surface of the face.

The gate electrode 7 is disposed on the gate insulating film 6. Although not depicted, an interlayer insulating film is thereafter disposed on the front surface side of the semiconductor device. A contact hole to dispose the source electrode 8 is disposed so as to penetrate the gate insulating film 6 and the interlayer insulating film, and the source electrode 8 is disposed to contact the N-type source region 4 and the P-type contact region 5. FIG. 3 depicts the state after the above process steps are executed.

Although not depicted, a gate pad to be electrically connected to the gate electrode 7 and a source pad to be electrically connected to the source electrode 8 are disposed thereafter. A protective film is disposed to cover the entire element structure.

As depicted in FIG. 4, the thickness of the N-type silicon carbide substrate 1 may be reduced when necessary by grinding the back surface of the N-type silicon carbide substrate 1. For example, the thickness of the N-type silicon carbide substrate 1 may be set to be about 15 µm to about 230 µm depending on the condition of the life time killer introduction region 10 of the semiconductor device. Thus, depth to introduce the life time killer may be controlled easily for conditions of the life time killer introduction region 10.

As depicted in FIG. 5, a portion of the back surface of the N-type silicon carbide substrate 1, corresponding to the region to have no life time killer implanted therein is coated with a resist or protective tape using a double-sided mask aligner. In the case of the example depicted in FIG. 5, because no life time killer is introduced into, for example, the Jfet region between the adjacent P-type regions 3, the portion corresponding to the Jfet region of the back surface of the N-type silicon carbide substrate 1 is coated with a resist or a protective tape. The life time killer introduction region 10 is disposed by implanting, for example, helium or protons from the back surface of the N-type silicon carbide substrate 1.

When helium or protons is/are implanted to dispose the life time killer introduction region 10, the implantation may be executed using the same apparatus as the apparatus for the ion implantation. By doing so, the life time killer introduction region 10 may be disposed with the same precision as with ordinary impurity diffusion layers. The substrate temperature during the implantation may be, for example, a normal temperature. The acceleration energy may be, for example, 100 MeV to several GeV. The implantation depth from the back surface of the N-type silicon carbide substrate 1 may be about 15 µm to about 230 µm depending on the condition of the life time killer introduction region 10 of the semiconductor device. Alternatively, for example, helium or protons may be implanted into a PN-junction portion formed at a depth of, for example, about 0.2 µm to about 2.0 µm from the surface of the N-type silicon carbide layer 2, or into the PN-junction portion and the N-type silicon carbide layer 2 at a depth of about 10 µm from the PN-junction portion.

A metal film to become the drain electrode 9 is disposed on the back surface of the N-type silicon carbide substrate 1. The drain electrode 9 is disposed by executing heat treatment. The N-type silicon carbide substrate 1 and the drain electrode 9 form an ohmic contact with each other. As described above, the semiconductor device depicted in FIG. 1 is completed.

According to the semiconductor device of the first embodiment, the speed of disappearance of the minority carriers is increased when the incorporated PN-diode is turned off because the life time killer is introduced in the entire interface between the N-type silicon carbide layer 2 and the P-type region 3. Reverse recovery loss of the PN-diode incorporated in the semiconductor device may therefore be reduced. Reduction of the resistance to breakdown of the PN-diode incorporated in the semiconductor device may be suppressed. According to the method of manufacturing according to the first embodiment, lattice defects to be the life time killer may be produced easily in the overall interface between the N-type silicon carbide layer 2 and the bottom face of the P-type region 3 by applying helium or protons from the back surface of the N-type silicon carbide substrate 1. The annealing step to be executed after introducing the life time killer may be omitted because the surface structure side of the element is not affected and therefore, the characteristics of the element such as the threshold voltage Vth of the MOSFET are not affected.

When the life time killer is introduced, the acceleration energy may be varied in multiple stages to implant helium or protons. When helium or protons is/are implanted in the multiple stages, the reverse recovery loss of the PN-diode incorporated in the semiconductor device may be reduced because a large number of recombination centers are present. On the other hand, when helium or protons is/are implanted in the multiple stages, the forward voltage drop Vf of the incorporated diode may increase. In contrast, when the life time killer is intensively introduced into the N-type silicon carbide layer 2 immediately beneath the PN-junction without varying the acceleration energy, increase of the forward voltage drop Vf may be suppressed. As described above, characteristics required of the PN-diode incorporated in the semiconductor device may be satisfied by facilitating optimization by changing the method of introducing the life time killer.

Figure 6:
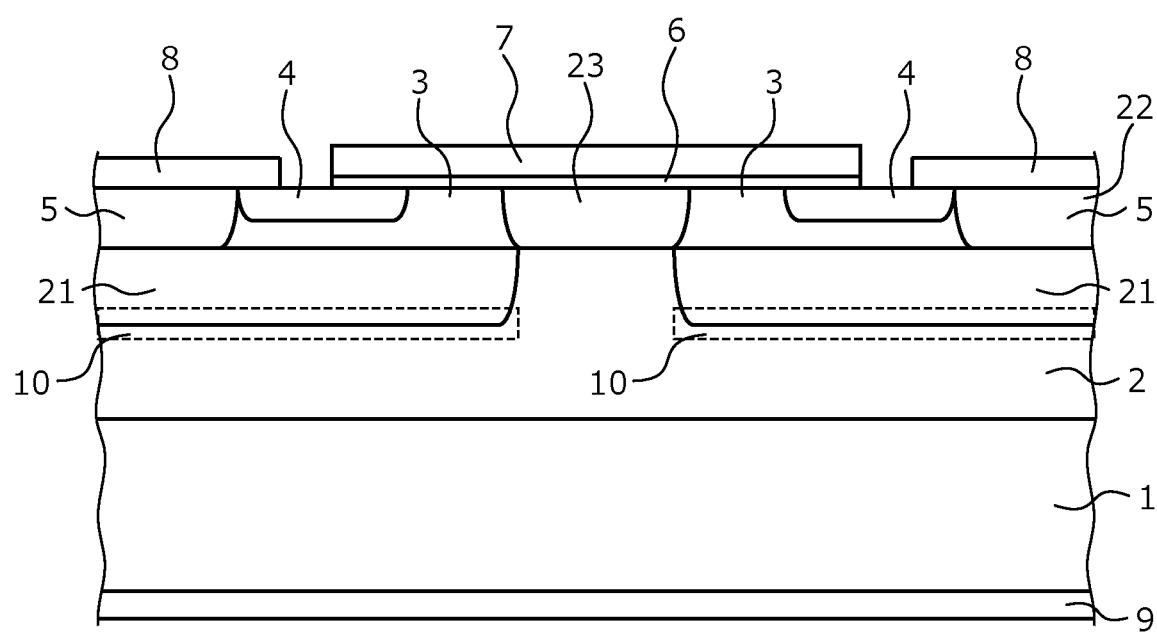
FIG. 6 is a cross-sectional view of a semiconductor device according to a second embodiment of the present invention.

FIG. 6 is a cross-sectional view of a semiconductor device according to a second embodiment of the present invention. FIG. 6 depicts the active region of the semiconductor device. The active region has the MOS structure, that is, the element structure of the semiconductor device disposed therein. The active region may be surrounded by a surrounding breakdown voltage structure region not depicted.

As depicted in FIG. 6, the semiconductor device includes an N-type silicon carbide substrate 1 and an N-type silicon carbide layer 2. The N-type silicon carbide substrate 1 and the N-type silicon carbide layer 2 are same as those of the example depicted in FIG. 1 and will not again be described.

The semiconductor device includes, for example, the P-type region 3, the N-type source region 4, the P-type contact region 5, the gate insulating film 6, the gate electrode 7, the source electrode 8, the life time killer introduction region 10, a P-type base region 21, a P-type silicon carbide layer 22, and an N-type region 23 as a MOS structure on the front surface side of the N-type silicon carbide substrate 1. The semiconductor device includes, for example, the drain electrode 9 on the back surface side of the N-type silicon carbide substrate 1.

The P-type base region 21 is disposed in a portion of the surface region of the N-type silicon carbide layer 2. The P-type base region 21 is disposed to sandwich another portion of the surface region of the N-type silicon carbide layer 2. The P-type base region 21 may be a semiconductor region having, for example, a P-type impurity doped in silicon carbide.

As indicated by a dotted line in FIG. 6, the life time killer introduction region 10 is disposed in the entire interface between the bottom face of the P-type base region 21 and the N-type silicon carbide layer 2 at the depth of the interface between the P-type base region 21 and the N-type silicon carbide layer 2. The life time killer introduction region 10 may be disposed in the interface between the bottom face of the P-type base region 21 and the N-type silicon carbide layer 2, and in the N-type silicon carbide layer 2, to the depth of, for example, about 10 μm from this interface, or to a depth of about 10 μm on each side of the interface. The life time killer is introduced in the life time killer introduction region 10 has introduced therein. The life time killer may be lattice defects produced by helium (He) or protons introduced into the life time killer introduction region 10.

The P-type silicon carbide layer 22 is disposed on the surface of the N-type silicon carbide layer 2. The P-type silicon carbide layer 22 may be a semiconductor layer that has, for example, a P-type impurity doped in silicon carbide.

The N-type region 23 is disposed on the surface of the region of the N-type silicon carbide layer 2 between the P-type base region 21 and the P-type base region 21 that are adjacent to each other. The N-type region 23 penetrates the P-type silicon carbide layer 22 so as to contact the region of the N-type silicon carbide layer 2 between the P-type base region 21 and the P-type base region 21 that are adjacent to each other. The impurity concentration of the N-type region 23 is lower than that of the N-type silicon carbide substrate 1. The N-type region 23 may be, for example, a region formed by inverting the conductivity type of a portion of the P-type silicon carbide layer 22 by ion implantation of an N-type impurity and heat treatment. The N-type region 23, for example, and the N-type silicon carbide layer 2 form an N-type drift region.

The P-type region 3 is a portion of the P-type silicon carbide layer 22 and is disposed on the surface of the P-type base region 21. The P-type region 3 is disposed to sandwich the N-type region 23.

The N-type source region 4 is disposed in the surface region of the P-type region 3 on the P-type base region 21. The N-type source region 4 is disposed away from the N-type region 23. The impurity concentration of the N-type source region 4 is higher than that of the N-type region 23.

The P-type contact region 5 may penetrate the P-type silicon carbide layer 22 so as to contact the P-type base region 21, in the P-type silicon carbide layer 22. The P-type contact region 5 is disposed away from the N-type region 23, on the side opposite the N-type region 23 sandwiching the N-type source region 4 therebetween. The P-type contact region 5 contacts the P-type region 3 and the N-type source region 4. The impurity concentration of the P-type contact region 5 is higher than that of the P-type silicon carbide layer 22.

The gate insulating film 6 is disposed on the surface of the region of the P-type region 3 in the P-type silicon carbide layer 22, between the N-type region 23 and the N-type source region 4.

The gate electrode 7, the source electrode 8, and the drain electrode 9 are same as those of the example depicted in FIG. 1 and will not again be described. The planar layout of the semiconductor device depicted in FIG. 6 is same as that of the example depicted in FIG. 1 and will not again be described.

Figure 7:
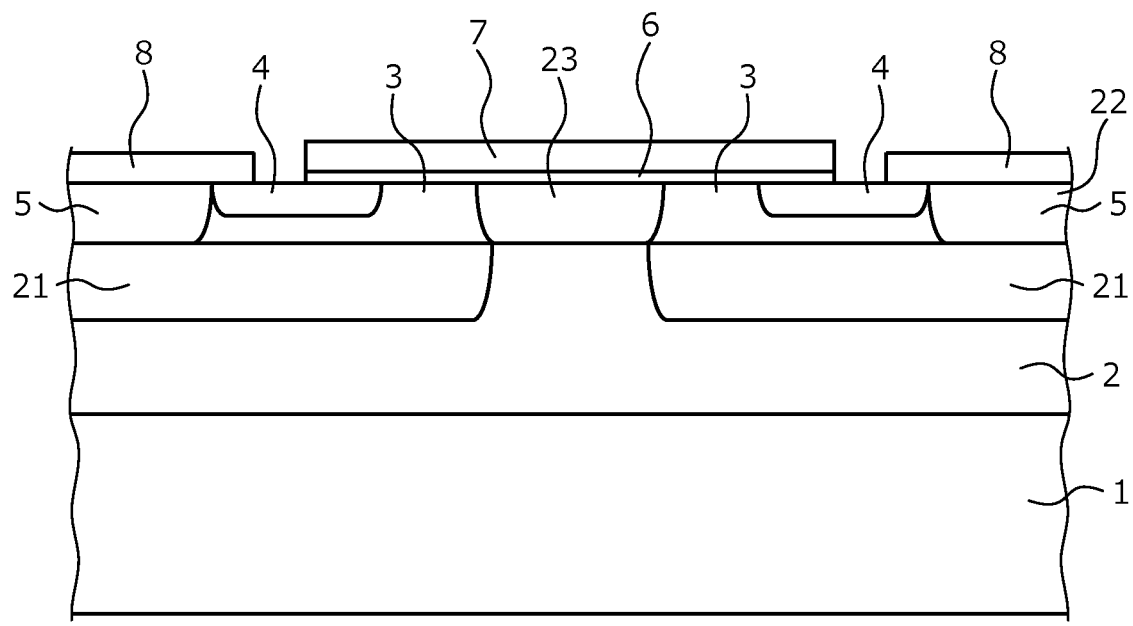
FIG. 7 is a cross-sectional view of a state of the semiconductor device depicted in FIG. 6 during manufacture.
Figure 8:
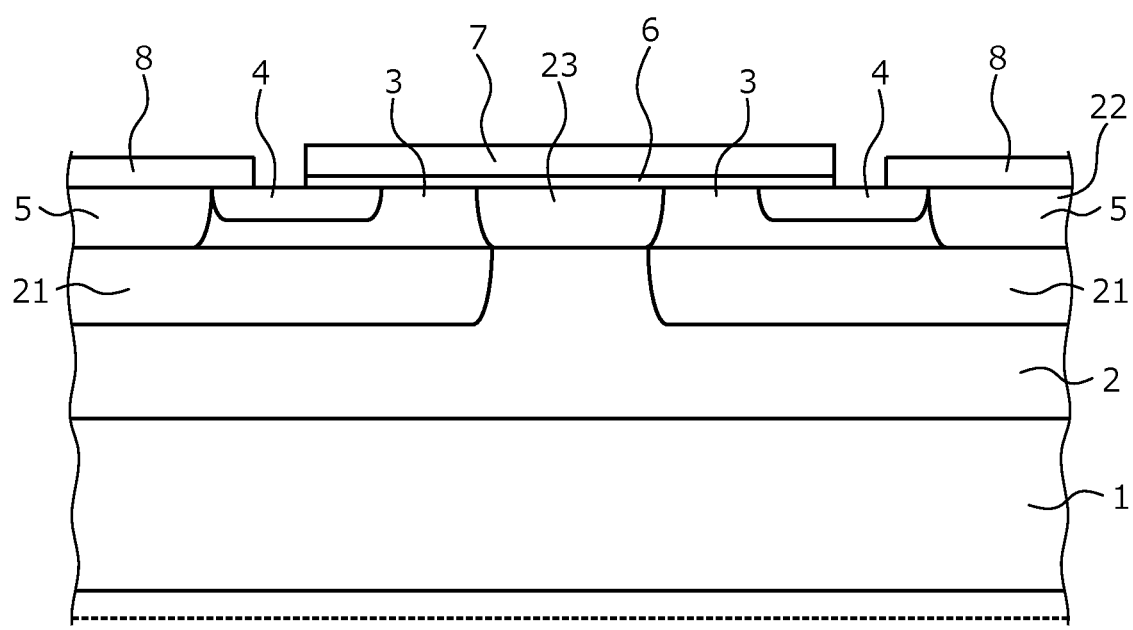
FIG. 8 is a cross-sectional view of a stage subsequent to that depicted in FIG. 7.
Figure 9:
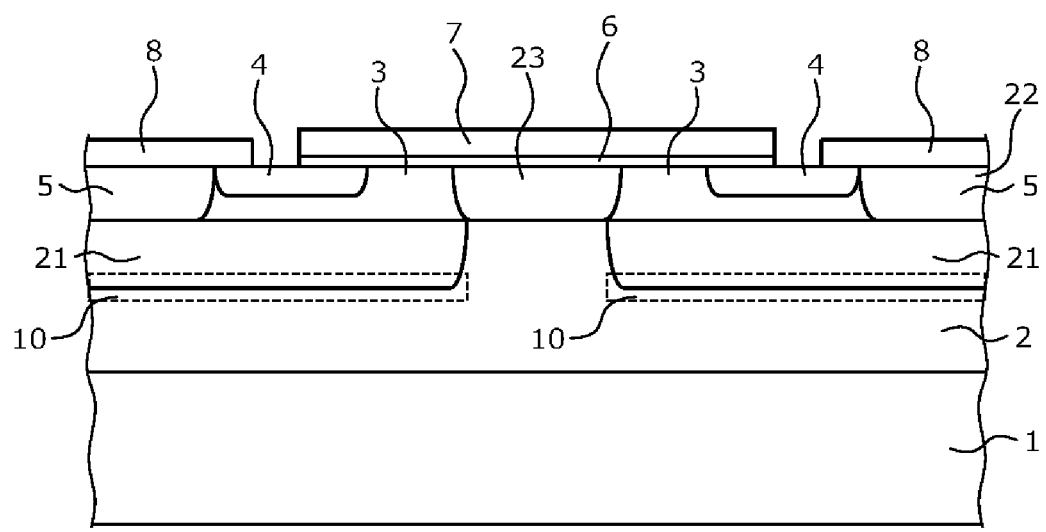
FIG. 9 is a cross-sectional view of a stage subsequent to that depicted in FIG. 8.

FIG. 7 is a cross-sectional view of the state of the semiconductor device depicted in FIG. 6 during manufacture. FIG. 8 is a cross-sectional view of a stage subsequent to that depicted in FIG. 7. FIG. 9 is a cross-sectional view of a stage subsequent to that depicted in FIG. 8. FIGS. 7 to 9 each depict a portion of the active region and do not depict the surrounding breakdown voltage structure region.

As depicted in FIG. 7, the N-type silicon carbide substrate 1 including N-type silicon carbide is first prepared. The N-type silicon carbide layer 2 including silicon carbide is epitaxial-grown being concurrently doped with, for example, an N-type impurity, on the front surface of the N-type silicon carbide substrate 1.

A P-type impurity is ion-implanted into the region to be the P-type base region 21 of the surface region of the N-type silicon carbide layer 2 by a photolithography technique and an ion implantation method. The P-type silicon carbide layer 22 including silicon carbide is epitaxial-grown being concurrently doped with, for example, a P-type impurity, on the surface of the N-type silicon carbide layer 2. The P-type silicon carbide layer 22 forms the P-type region 3.

An N-type impurity is ion-implanted into the region to be the N-type region 23 of the P-type silicon carbide layer 22 by a photolithography technique and an ion implantation method. An N-type impurity is ion-implanted into the region to be the N-type source region 4 of the P-type silicon carbide layer 22 by a photolithography technique and an ion implantation method.

A P-type impurity is ion-implanted into the region to be the P-type contact region 5 of the P-type silicon carbide layer 22 by a photolithography technique and an ion implantation method. The order of the ion implantation to dispose the P-type base region 21, the ion implantation to dispose the N-type region 23, the ion implantation to dispose the N-type source region 4, and the ion implantation to dispose the P-type contact region 5 is not limited to the above order and may be changed variously.

The ion-implanted regions to be, for example, the P-type base region 21, the N-type region 23, the N-type source region 4, and the P-type contact region 5 are activated by executing heat treatment (annealing). The P-type base region 21, the N-type region 23, the N-type source region 4, and the P-type contact region 5 are thereby formed. The ion-implanted regions may be activated collectively by a single heat treatment session as above, or each of the ion-implanted regions may be activated by executing the heat treatment each time the ion implantation is executed for a region.

The face on the side where the P-type region 3, the N-type source region 4, the P-type contact region 5, and the N-type region 23 are disposed is thermally oxidized to dispose the gate insulating film 6 on the entire surface of this face.

The gate electrode 7 is disposed on the gate insulating film 6. Although not depicted, an interlayer insulating film is disposed thereafter on the front surface side of the semiconductor device. A contact hole to dispose the source electrode 8 is disposed so as to penetrate the gate insulating film 6 and the interlayer insulating film, and the source electrode 8 is disposed to contact the N-type source region 4 and the P-type contact region 5. FIG. 7 depicts the state after the above process steps are executed.

Although not depicted, a gate pad to be electrically connected to the gate electrode 7 and a source pad to be electrically connected to the source electrode 8 are disposed thereafter. A protective film is disposed to cover the entire element structure.

As depicted in FIG. 8, the thickness of the N-type silicon carbide substrate 1 may be reduced when necessary by grinding the back surface of the N-type silicon carbide substrate 1. The thickness of the N-type silicon carbide substrate 1 for the case where the thickness of the N-type silicon carbide substrate 1 is reduced is as described for the semiconductor device depicted in FIG. 1 and will not again be described. The depth to introduce the life time killer may be controlled easily for conditions for the life time killer introduction region 10 by adjusting the thickness of the N-type silicon carbide substrate 1.

As depicted in FIG. 9, the portion corresponding to the region of the back surface of the N-type silicon carbide substrate 1 where no life time killer is to be implanted is coated with a resist or protective tape using a double-sided mask aligner. In the case of the example depicted in FIG. 9, because no life time killer is introduced into, for example, the Jfet region between the adjacent P-type base regions 21, the portion corresponding to the Jfet region of the back surface of the N-type silicon carbide substrate 1 is coated with a resist or protective tape.

For example, helium or protons is/are implanted from the back surface of the N-type silicon carbide substrate 1 to dispose the life time killer introduction region 10 using, for example, the same apparatus as the apparatus for the ion implantation. The substrate temperature, the acceleration energy, and the implantation depth from the back surface of the N-type silicon carbide substrate 1 are as described above and will not again be described.

A metal film to become the drain electrode 9 is disposed on the back surface of the N-type silicon carbide substrate 1. The drain electrode 9 is disposed by executing heat treatment. The N-type silicon carbide substrate 1 and the drain electrode 9 form an ohmic contact with each other. As described above, the semiconductor device depicted in FIG. 6 is completed.

According to the semiconductor device of the second embodiment, the speed of disappearance of the minority carriers is increased when the incorporated PN-diode is turned off because the life time killer is introduced in the entire interface between the N-type silicon carbide layer 2 and the bottom face of the P-type base region 21. Reverse recovery loss of the PN-diode incorporated in the semiconductor device may therefore be reduced. Reduction of the resistance to breakdown of the PN-diode incorporated in the semiconductor device may be suppressed. According to the method of manufacturing according to the second embodiment, lattice defects to be the life time killer can easily be produced in the entire interface between the N-type silicon carbide layer 2 and the bottom face of the P-type base region 21 by applying helium or protons from the back surface of the N-type silicon carbide substrate 1. The annealing step to be executed after the introduction of the life time killer may be omitted because the surface structure side of the element is not affected and therefore, the characteristics of the element such as the threshold voltage Vth of the MOSFET are not affected.

Similar to the first embodiment, when the life time killer is introduced, the acceleration energy may be varied in multiple stages to implant helium or protons. The characteristics required of the PN-diode incorporated in the semiconductor device may be satisfied by facilitating the optimization by changing the method of introducing the life time killer.

Figure 10:
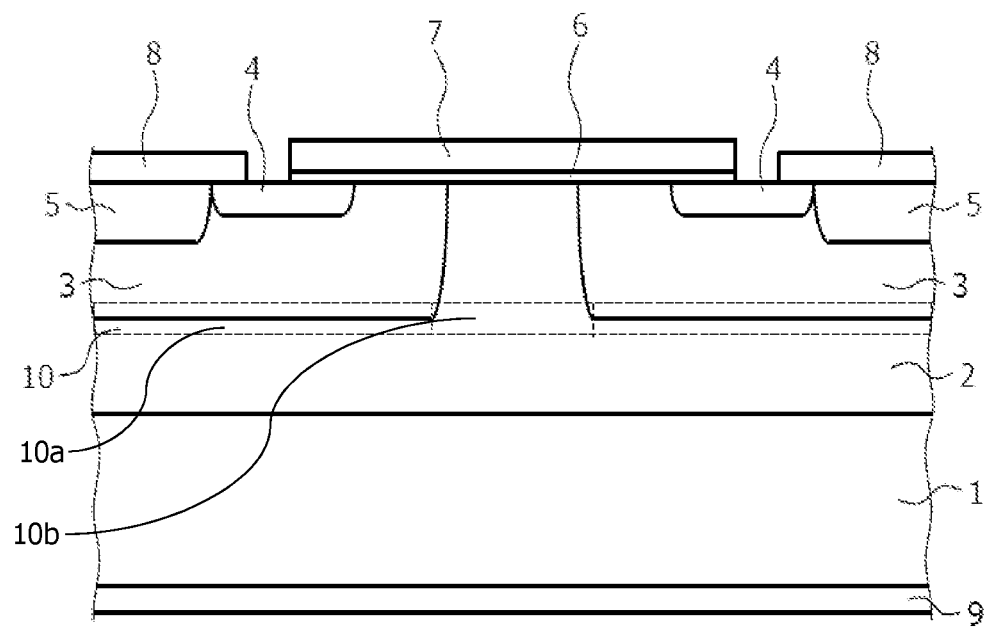
FIG. 10 is a cross-sectional view of a semiconductor device according to a third embodiment of the present invention.

FIG. 10 is a cross-sectional view of a semiconductor device according to a third embodiment of the present invention. As depicted in FIG. 10, the semiconductor device according to the third embodiment is formed by introducing the life time killer also into the Jfet region (10b) between the adjacent P-type regions 3 in the semiconductor device according to the first embodiment depicted in FIG. 1. The life time killer introduction region 10 (10a, 10b) is disposed in the entire region at a depth equal to that of the interface between the N-type silicon carbide layer 2 and the bottom face of the P-type region 3. That is, the life time killer introduction region (first part) 10a is disposed in the overall interface between the bottom face of the P-type region 3 and the N-type silicon carbide layer 2, and the life time killer introduction region (second part) 10b is disposed between the adjacent P-type regions 3.

The procedure for manufacturing the semiconductor device depicted in FIG. 10 is as described for the semiconductor device depicted in FIG. 1. However, the portion of the back surface of the N-type silicon carbide substrate 1 corresponding to the region where no life time killer is to be implanted does not need to be coated with a resist or protective tape because, for example, helium or protons is/are implanted into the overall region at a depth equal to that of the interface between the N-type silicon carbide layer 2 and the bottom face of the P-type region 3. A resist application step and a photolithography step are therefore unnecessary to produce the resist mask for the implantation of the life time killer and the manufacturing process is simplified.

According to the semiconductor device of the third embodiment, the speed of disappearance of the minority carriers implanted from the PN-junction portion between the N-type silicon carbide layer 2 and the bottom face of the P-type region 3, and the PN-junction portion beside the Jfet region is increased when the incorporated PN-diode is turned off, because the life time killer is introduced into the entire region at a depth equal to that of the interface between the N-type silicon carbide layer 2 and the bottom face of the P-type region 3. The reverse recovery loss of the PN-diode incorporated in the semiconductor device may be reduced. Reduction of the resistance to breakdown of the PN-diode incorporated in the semiconductor device may be suppressed.

Similar to the first embodiment, the acceleration energy may be varied in multiple stages to implant helium or protons when the life time killer is introduced. The characteristics required of the PN-diode incorporated in the semiconductor device may be satisfied by facilitating the optimization by changing the method of introducing the life time killer.

Figure 11:
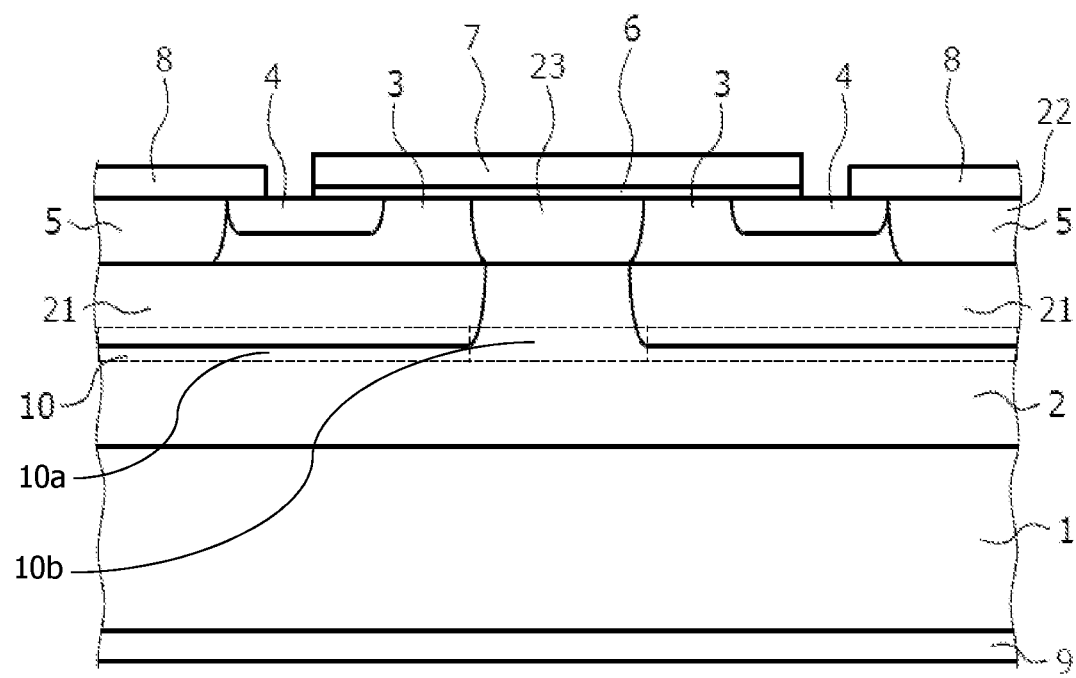
FIG. 11 is a cross-sectional view of a semiconductor device according to a fourth embodiment of the present invention.

FIG. 11 is a cross-sectional view of the semiconductor device according to a fourth embodiment of the present invention. As depicted in FIG. 11, the semiconductor device according to the fourth embodiment is formed by introducing the life time killer also into the Jfet region between the P-type base region 21 and the adjacent P-type base regions 21 in the semiconductor device according to the second embodiment depicted in FIG. 6. The life time killer introduction region 10 is disposed in the entire region at a depth equal to that of the interface between the N-type silicon carbide layer 2 and the bottom face of the P-type base region 21.

The procedure for manufacturing the semiconductor device depicted in FIG. 11 is as described for the semiconductor device depicted in FIG. 6. However, the portion corresponding to the region of the back surface of the N-type silicon carbide substrate 1 where no life time killer is to be implanted does not need to be coated with a resist or protective tape because, for example, helium or protons is/are implanted into the entire region at a depth equal to that of the interface between the N-type silicon carbide layer 2 and the bottom face of the P-type base region 21. A resist application step and a photolithography step are therefore unnecessary to produce the resist mask for the implantation of the life time killer and the manufacturing process is simplified.

According to the semiconductor device of the fourth embodiment, the speed of disappearance of the minority carriers injected from the PN-junction portion between the N-type silicon carbide layer 2 and the bottom face of the P-type base region 21, and the PN-junction portion beside the Jfet region is increased when the incorporated PN-diode is turned off because the life time killer is introduced into the entire region at a depth equal to that of the interface between the N-type silicon carbide layer 2 and the bottom face of the P-type base region 21. Reverse recovery loss of the PN-diode incorporated in the semiconductor device may therefore be reduced. Reduction of the resistance to breakdown of the PN-diode incorporated in the semiconductor device may be suppressed.

Similar to the second embodiment, when the life time killer is introduced, the acceleration energy may be varied in multiple stages to implant helium or protons. The characteristics required of the PN-diode incorporated in the semiconductor device may be satisfied by facilitating optimization by changing the method of introducing the life time killer.

However, in the conventional semiconductor device, for example, a PN-diode is incorporated that is formed by an N-type silicon carbide substrate and an N-type region of an N-type silicon carbide layer, and a P-type region. When the MOSFET is in an OFF-state, a positive voltage is applied to a source electrode and a negative voltage is applied to a drain electrode to drive this PN diode. In this state, however, when a positive voltage is applied to the drain electrode to turn off the PN-diode, the accumulated carriers are increased and a problem therefore arises in that degradation of the loss and reduction of the cutoff current are caused. Even when a recombination region is disposed beneath the high concentration P-type region between the N-type source region and the N-type source region that are adjacent to each other, reverse recovery loss of the PN-diode cannot be reduced sufficiently.

According to the present invention, the speed of disappearance of the minority carriers is increased when the incorporated PN-diode is turned off because the life time killer to be the recombination center for the minority carriers is introduced into the overall interface between the silicon carbide layer of the first conductivity type and the bottom face of the second conductivity type region.

According to the present invention, the speed of disappearance of the minority carriers is increased when the incorporated PN-diode is turned off because the life time killer is also introduced into the Jfet region between adjacent second conductivity type regions.

According to the present invention, the speed of disappearance of the minority carriers is increased when the incorporated PN-diode is turned off because the life time killer to be the recombination center for the minority carriers is introduced into the overall interface between the silicon carbide layer of the first conductivity type and the bottom face of the base region of the second conductivity type.

According to the present invention, the speed of disappearance of the minority carriers is increased when the incorporated PN-diode is turned off because the life time killer is also introduced into the Jfet region between adjacent base regions of the second conductivity type.

According to the present invention, lattice defects to be the life time killer may be produced in the silicon carbide semiconductor by applying helium or protons.

According to the present invention, the annealing step to be executed after the introduction of the life time killer may be excluded because the surface structure side of the element is not affected and therefore, the characteristics of the element are not affected.

According to the present invention, the annealing step to be executed after the introduction of the life time killer may be excluded because the surface structure side of the element is not affected and therefore, the characteristics of the element are not affected.

According to the present invention, the depth to introduce the life time killer may be controlled easily.

According to the semiconductor device and the method of manufacturing a semiconductor device of the present invention, reverse recovery loss of the PN-diode incorporated in the semiconductor device may be reduced. Reduction of the resistance to breakdown of the PN-diode incorporated in the semiconductor device may be suppressed.

In the description above, the present invention is not limited to the embodiments and may be changed variously. For example, the values described in the embodiments are each one example and the present invention is not limited to those values. In the embodiments, the first conductivity type is the N type and the second conductivity type is the P type. Nonetheless, the present invention is applicable when the first conductivity type is the P type and the second conductivity type is the N type.

As described above, the semiconductor device and the method of manufacturing a semiconductor device according to the present invention are useful for a semiconductor device that is usable as, for example, a switching device disposed on a silicon carbide substrate and is especially suitable for a semiconductor device such as a vertical MOSFET that includes silicon carbide.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
a silicon carbide substrate of a first conductivity type;
a silicon carbide layer of the first conductivity type, disposed on a front surface of the silicon carbide substrate and having an impurity concentration lower than that of the silicon carbide substrate;
a first region of a second conductivity type, disposed in a portion of a surface region of the silicon carbide layer;
a source region of the first conductivity type, disposed in a surface region of the first region;
a contact region of the second conductivity type, disposed in the surface region of the first region and having an impurity concentration higher than that of the first region;
a source electrode disposed so as to contact the source region and the contact region;
a gate insulating film disposed on the first region of the second conductivity type;
a gate electrode disposed on the gate insulating film;
a drain electrode disposed on a back surface of the silicon carbide substrate opposite the front surface; and
a lifetime killer introduction region in which a lifetime killer is implanted, the lifetime killer introduction region having a first part and a second part, the first part being disposed along and at an interface region of the silicon carbide layer and a bottom surface of the first region, the bottom surface of the first region facing the silicon carbide substrate, each of the first part and the bottom surface of the first region having a planar surface that is beneath the gate electrode, the source electrode and the contact region, the second part being disposed in the silicon carbide layer, and abutting the first part.

2. The semiconductor device according to claim 1, wherein the lifetime killer comprises one or both of helium or protons.

3. A semiconductor device comprising:
a silicon carbide substrate of a first conductivity type;
a first silicon carbide layer of the first conductivity type, disposed on a front surface of the silicon carbide substrate and having an impurity concentration lower than that of the silicon carbide substrate;
a base region of a second conductivity type, disposed in a surface region of the first silicon carbide layer;
a second silicon carbide layer of the second conductivity type, disposed on a surface of the first silicon carbide layer;
a first region of the first conductivity type, disposed in the second silicon carbide layer so as to penetrate from a front surface of the second silicon carbide layer through the second silicon carbide layer and contact the first silicon carbide layer, the first region having an impurity concentration lower than that of the silicon carbide substrate;
a source region of the first conductivity type, disposed in a surface region of the second silicon carbide layer, separate from the first region, the source region having an impurity concentration higher than that of the first region;
a contact region of the second conductivity type, disposed in the second silicon carbide layer so as to penetrate from the front surface of the second silicon carbide layer through the second silicon carbide layer and contact the base region, the contact region having an impurity concentration higher than that of the base region;
a source electrode disposed so as to contact the source region and the contact region;
a gate insulating film disposed on the front surface of the second silicon carbide layer;
a gate electrode that is disposed on the gate insulating film;
a drain electrode disposed on a back surface of the silicon carbide substrate; and
a lifetime killer introduction region in which a lifetime killer is implanted, the lifetime killer introduction region having a first part and a second part, the first part being disposed along and at an interface region of the first silicon carbide layer and a bottom surface of the base region, the bottom surface of the first base region facing the silicon carbide substrate, the second part being disposed in the first silicon carbide layer, and abutting the first part.

4. The semiconductor device according to claim 3, wherein the lifetime killer comprises one or both of helium or protons.

5. A method of manufacturing a semiconductor device, the method comprising:
- forming a silicon carbide layer of a first conductivity type on a front surface of a silicon carbide substrate of the first conductivity type;
- forming a first region of a second conductivity type in a surface region of the silicon carbide layer;
- forming a source region and a contact region in a surface region of the first region;
- forming a source electrode on the contact region and the source region;
- forming a gate insulating film on a portion of the silicon carbide layer;
- forming a gate electrode on the gate insulating film;
- forming a lifetime killer introduction region by implanting a life lifetime killer from a back surface of the silicon carbide substrate, wherein the lifetime killer introduction region has a first part and a second part, the first part being disposed along and at an interface region of the silicon carbide layer and a bottom surface of the first region, the bottom surface of the first region facing the silicon carbide substrate, each of the first part and the bottom surface of the first region having a planar surface that is beneath the gate electrode, the source electrode and the contact region, the second part being disposed in the silicon carbide layer, and abutting the first part; and
- forming a drain electrode on the back surface of the silicon carbide substrate after introducing the lifetime killer.

6. The method according to claim 5, further comprising adjusting a thickness of the silicon carbide substrate by grinding the back surface of the silicon carbide substrate before introducing the lifetime killer.

7. A method of manufacturing a semiconductor device, the method comprising:
- forming a first silicon carbide layer of a first conductivity type on a front surface of a silicon carbide substrate of the first conductivity type;
- forming a base region of a second conductivity type in a portion of a surface region of the first silicon carbide layer;
- forming a second silicon carbide layer of the second conductivity type on the first silicon carbide layer;
- forming a second region of the second conductivity type in a surface of the second silicon carbide layer;
- forming a source region and a contact region in the second region of the second conductivity type;
- forming a source electrode on the source region and the contact region;
- forming a gate insulating film on a portion of the second silicon carbide layer;
- forming a lifetime killer introduction region by implanting a lifetime killer from a back surface of the silicon carbide substrate, wherein the lifetime killer introduction region has a first part and a second part, the first part being disposed along and at an interface region of the first silicon carbide layer and a bottom surface of the base region, the bottom surface of the first base region facing the silicon carbide substrate, the second part being disposed in the first silicon carbide layer, and abutting the first part; and
- forming a drain electrode on the back surface of the silicon carbide substrate after introducing the lifetime killer.

8. The method according to claim 7, further comprising adjusting a thickness of the silicon carbide substrate by grinding the back surface of the silicon carbide substrate before introducing the lifetime killer.

* * * * *